(12) United States Patent
Fan et al.

(10) Patent No.: US 7,522,415 B2
(45) Date of Patent: Apr. 21, 2009

(54) MOUNTING ASSEMBLY FOR FAN

(75) Inventors: Chen-Lu Fan, Tu-Cheng (TW); Chieh Yang, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 294 days.

(21) Appl. No.: 11/309,197

(22) Filed: Jul. 13, 2006

(65) Prior Publication Data

US 2008/0014093 A1   Jan. 17, 2008

(51) Int. Cl.
*H05K 7/20* (2006.01)
*G06F 1/16* (2006.01)

(52) U.S. Cl. ................. 361/695; 361/690; 361/694; 415/213.1; 312/236; 454/186

(58) Field of Classification Search ............ 361/690, 361/694, 695; 312/236; 454/184–186; 415/213.1
See application file for complete search history.

(56) References Cited

U.S. PATENT DOCUMENTS

| | | | | |
|---|---|---|---|---|
| 5,208,730 | A * | 5/1993 | Tracy | 361/687 |
| 6,236,564 | B1 * | 5/2001 | Fan | 361/695 |
| 6,244,953 | B1 * | 6/2001 | Dugan et al. | 454/184 |
| 6,351,380 | B1 * | 2/2002 | Curlee et al. | 361/695 |
| 6,373,698 | B1 * | 4/2002 | Christensen | 361/695 |
| 6,493,225 | B2 * | 12/2002 | Chuang et al. | 361/695 |
| 6,587,342 | B1 | 7/2003 | Hsu | |
| 6,592,327 | B2 * | 7/2003 | Chen et al. | 415/213.1 |
| 6,604,916 | B2 * | 8/2003 | Lu et al. | 417/360 |
| 6,663,416 | B2 * | 12/2003 | Huang et al. | 439/485 |
| 6,714,411 | B2 | 3/2004 | Thompson et al. | |
| 6,826,048 | B1 * | 11/2004 | Dean et al. | 361/695 |
| 6,839,233 | B2 * | 1/2005 | Cravens et al. | 361/695 |
| 6,851,925 | B2 | 2/2005 | Chuang | |
| 6,865,078 | B1 | 3/2005 | Chang | |
| 7,002,796 | B2 * | 2/2006 | Lao et al. | 361/695 |
| 7,054,155 | B1 * | 5/2006 | Mease et al. | 361/695 |
| 7,170,744 | B2 * | 1/2007 | Li | 361/687 |
| 2004/0202541 | A1 * | 10/2004 | Stewart et al. | 415/213.1 |
| 2005/0174734 | A1 * | 8/2005 | Chen et al. | 361/695 |
| 2006/0003683 | A1 * | 1/2006 | Chen | 454/184 |
| 2006/0203446 | A1 * | 9/2006 | Radhakrishnan et al. | 361/695 |
| 2006/0268514 | A1 * | 11/2006 | Fan et al. | 361/695 |
| 2006/0285292 | A1 * | 12/2006 | Fan et al. | 361/695 |
| 2007/0155301 | A1 * | 7/2007 | Chen et al. | 454/184 |

* cited by examiner

*Primary Examiner*—Anatoly Vortman
(74) *Attorney, Agent, or Firm*—Wei Te Chung

(57) ABSTRACT

A mounting assembly includes a chassis having a plurality of opposite receiving tabs thereon, and a plurality of bracket subassemblies slidably mounted to the chassis along the receiving tabs of the chassis. Each bracket subassembly secures a fan therein and includes a bracket having a rear wall and two opposite sidewalls, a positioning member, and a lift-out apparatus attached to the bracket. The lift-out apparatus includes a clasping member fixed to the bracket, a sliding member slidably sandwiched between the sidewall of the bracket and the clasping member, and an elastic member. A locking structure is formed on the sliding member and the sidewall of the bracket. When the locking structure is unlocked, the sliding member is lifted out due to rebounding of the elastic member. The sliding member is then pulled to urge the bracket subassembly to disengage from the chassis.

19 Claims, 10 Drawing Sheets

MOUNTING ASSEMBLY FOR FAN

FIELD OF THE INVENTION

The present invention relates to mounting assemblies for fans, and more particularly to a mounting assembly for a fan in a server system for fast and convenient assembly or disassembly.

DESCRIPTION OF RELATED ART

Servers are widely used in network systems to provide multifold services for terminals at the client ends, such as disk storage or printing services for users. A large server system is generally a system including many servers, and demand for large server systems has grown in recent years. The biggest issue in computer systems is heat dissipation. As the server systems have to process a great number of tasks, their reliability is more critical than general computer systems. In order to maintain normal operation of the server systems, heat must be dissipated effectively. One of the approaches for dissipating heat usually adopted is to increase the number of cooling fans.

A kind of hot-plug fan is commonly used in a server system since it allows the fan to be replaced immediately due to malfunctioning during the course of operating the server. System maintenance personnel can replace or insert the hot-plug fan without shutting down the servers. Furthermore, the hot-plug fan also has a fastening structure for coupling with the server. The most commonly adopted approach is fastening the hot-plug fan to the server with screws or bolts. However, the use of screws or bolts is comparatively inconvenient for making fast insertion or replacement of the hot-plug fan. Accordingly, an improved mounting assembly for a fan in a server system, which solves the above-mentioned problems, is strongly desired.

What is needed, therefore, is to provide a mounting assembly for a fan in a server system, that allows fast and convenient installation or removal of the fan.

SUMMARY OF THE INVENTION

A mounting assembly includes a chassis having a plurality of opposite receiving tabs thereon, and a plurality of bracket subassemblies slidably mounted to the chassis along the receiving tabs of the chassis. Each bracket subassembly for securing a fan therein includes a bracket having a rear wall and two opposite sidewalls, a positioning member, and a lift-out apparatus attached to the bracket. The lift-out apparatus includes a clasping member fixed to the bracket, a sliding member slidably sandwiched between the sidewall of the bracket and the clasping member, and an elastic member. A locking structure is formed on the sliding member and the sidewall of the bracket. When the locking structure is unlocked, the sliding member is lifted out due to rebounding of the elastic member. The sliding member is then pulled to urge the bracket subassembly to disengage from the chassis.

Other advantages and novel features will be drawn from the following detailed description of preferred embodiment with the attached drawings, in which:

DETAILED DESCRIPTION OF THE INVENTION

Figure 1:
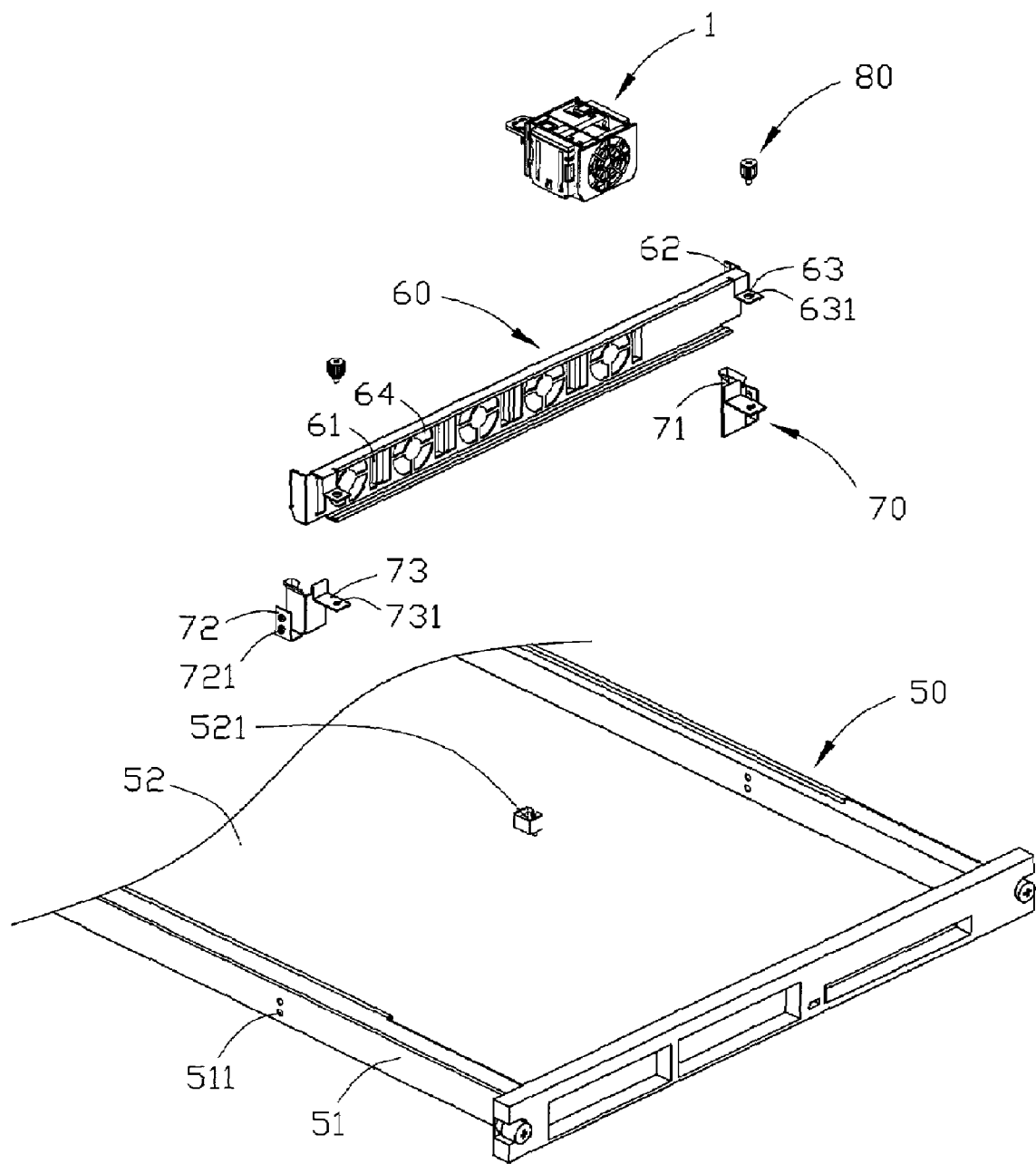
FIG. 1 is an exploded, isometric view of a mounting assembly in accordance with a preferred embodiment of the present invention including a bracket subassembly for accommodating a fan, a chassis, a pair of retainers mounted on the chassis, and a securing plate mounted on the retainers.

Referring to FIG. 1, a mounting assembly in accordance with a preferred embodiment of the present invention includes a chassis 50, a pair of retainers 70 mounted on the chassis 50, a securing plate 60 mounted on the retainers 70, and at least one bracket subassembly 1. The securing plate 60 is mounted on the retainers 70 via a pair of fasteners such as thumb screws 80.

The chassis 50 includes two opposite side panels 51 and a bottom panel 52. A pair of through holes 511 is defined in each of the side panels 51. A first connector 521 is coupled to the bottom panel 52 of the chassis 50 for each bracket subassembly 1 to be installed.

Each of the retainers 70 includes an L-shaped positioning tab 71, a connecting tab 72, and a support tab 73. The support tab 73 defines a screw hole 731 therein, and the connecting tab 72 defines a pair of locking holes 721 corresponding to the through holes 511 of the chassis 50. A pair of locking members (not shown), such as screws or the like, extends through the through holes 511 of the chassis 50 to engage in the corresponding locking holes 721 of the connecting tab 72, thereby securing the retainers 70 to the chassis 50.

Figure 7:
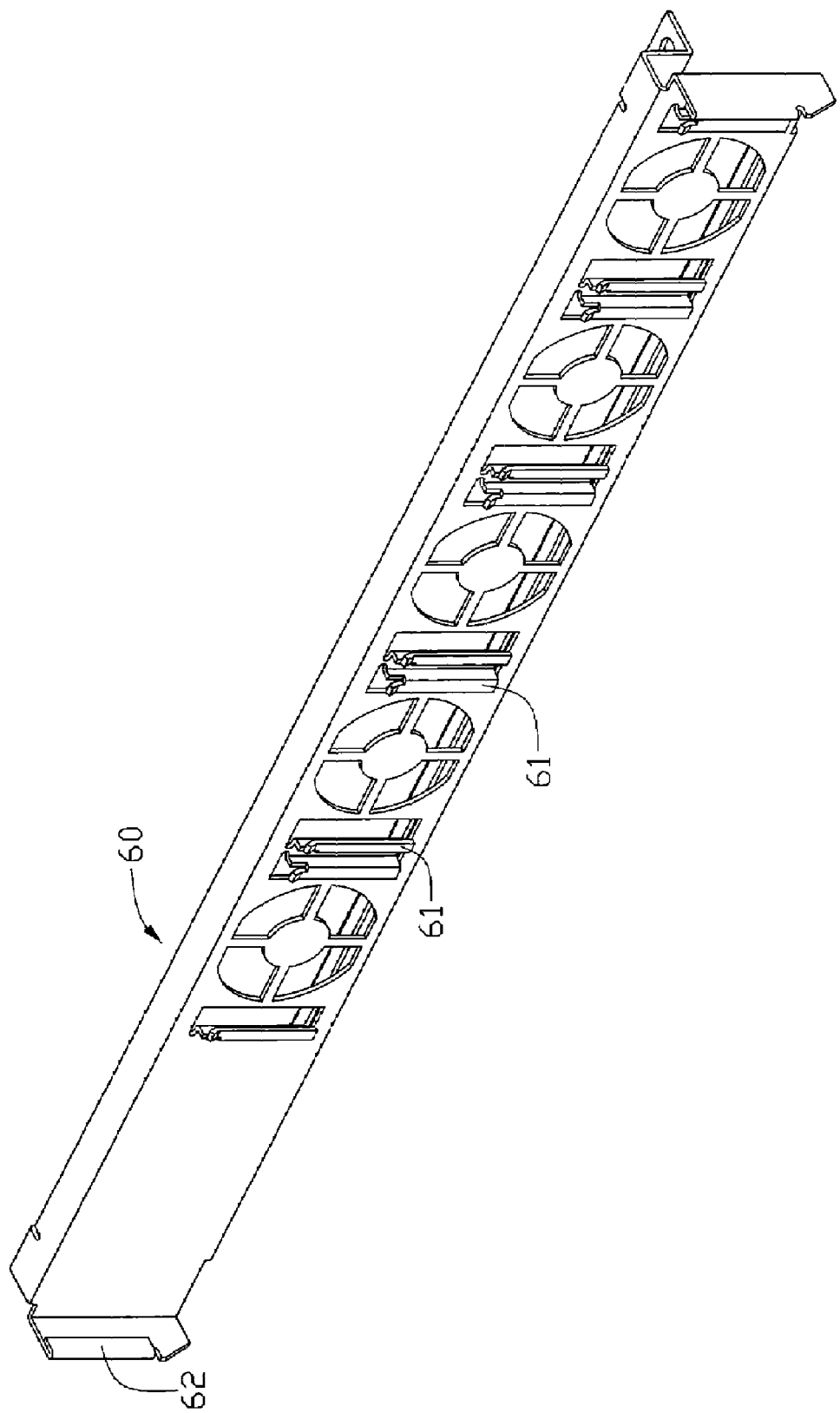
FIG. 7 is an enlarged, isometric view of the securing plate of FIG. 1, but viewed from another aspect.
Figure 8:
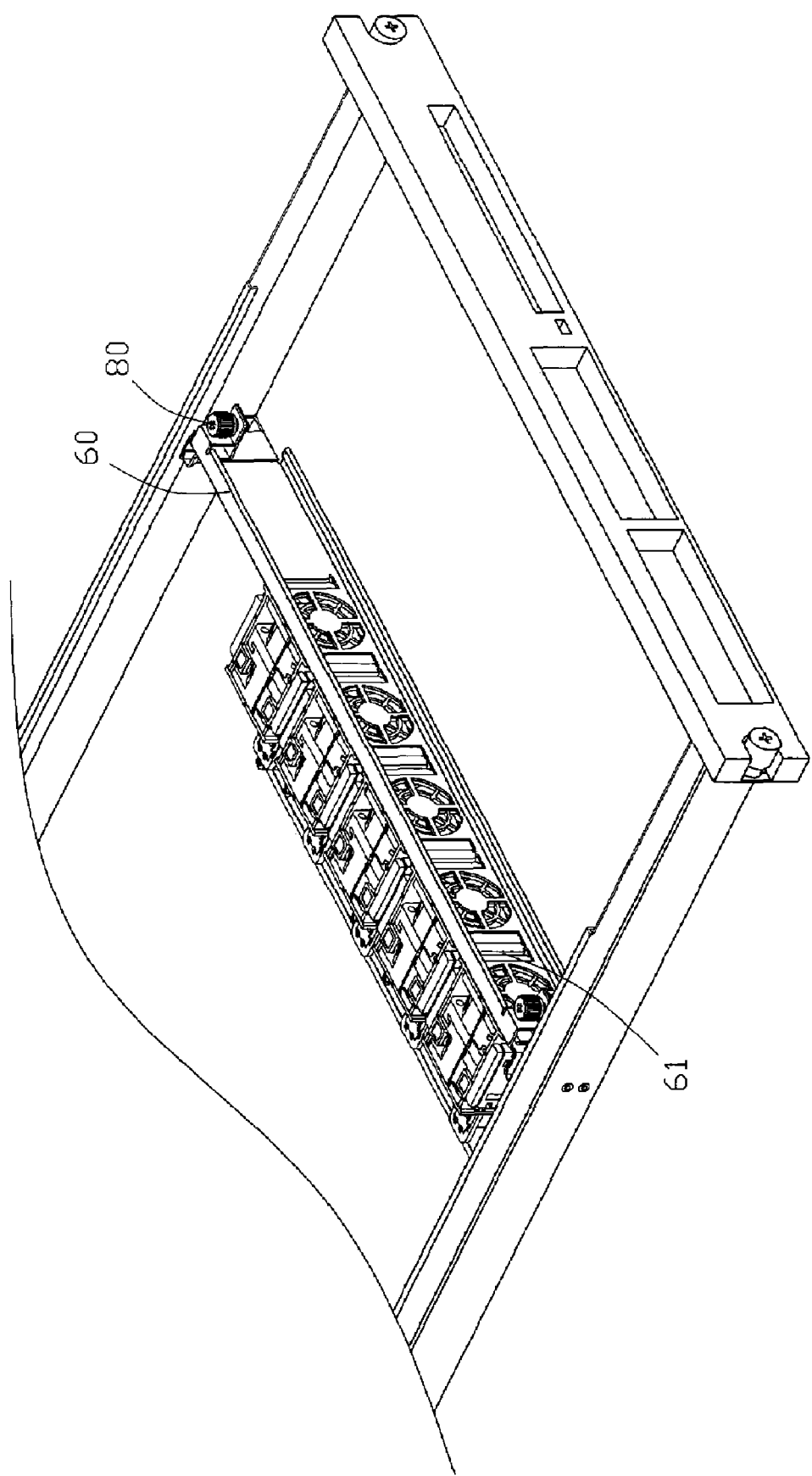
FIG. 8 is an assembled view of FIG. 1.

Referring also to FIGS. 7 and 8, the securing plate 60 is formed to have a plurality of pairs of opposite L-shaped receiving tabs 61, each pair of receiving tabs 61 capable of receiving a bracket subassembly 1 therebetween. Two opposite ends of the securing plate 60 are bent to form an insert tab 62, respectively. A securing tab 63 extends horizontally from each end of the securing plate 60. A screw hole 631 is defined in each of the securing tabs 63. A plurality of vents 64, arranged in a row, is defined in the securing plate 60. In assembly of the securing plate 60, the insert tabs 62 of the securing plate 60 are inserted in the corresponding L-shaped positioning tabs 71, while the securing tabs 63 of the securing plate 60 are attached to the corresponding support tabs 73 of the retainers 70, and the screw holes 631 of the securing tabs 63 are respectively aligned with the screw holes 731 of the support tabs 73. The thumb screws 80 respectively pass through the screw holes 631 to engage in the screw holes 731, thereby mounting the securing plate 60 to the chassis 50 via the retainers 70. Alternatively, the securing plate 60 can be directly mounted to the chassis 50 without the retainers 70.

Figure 2:
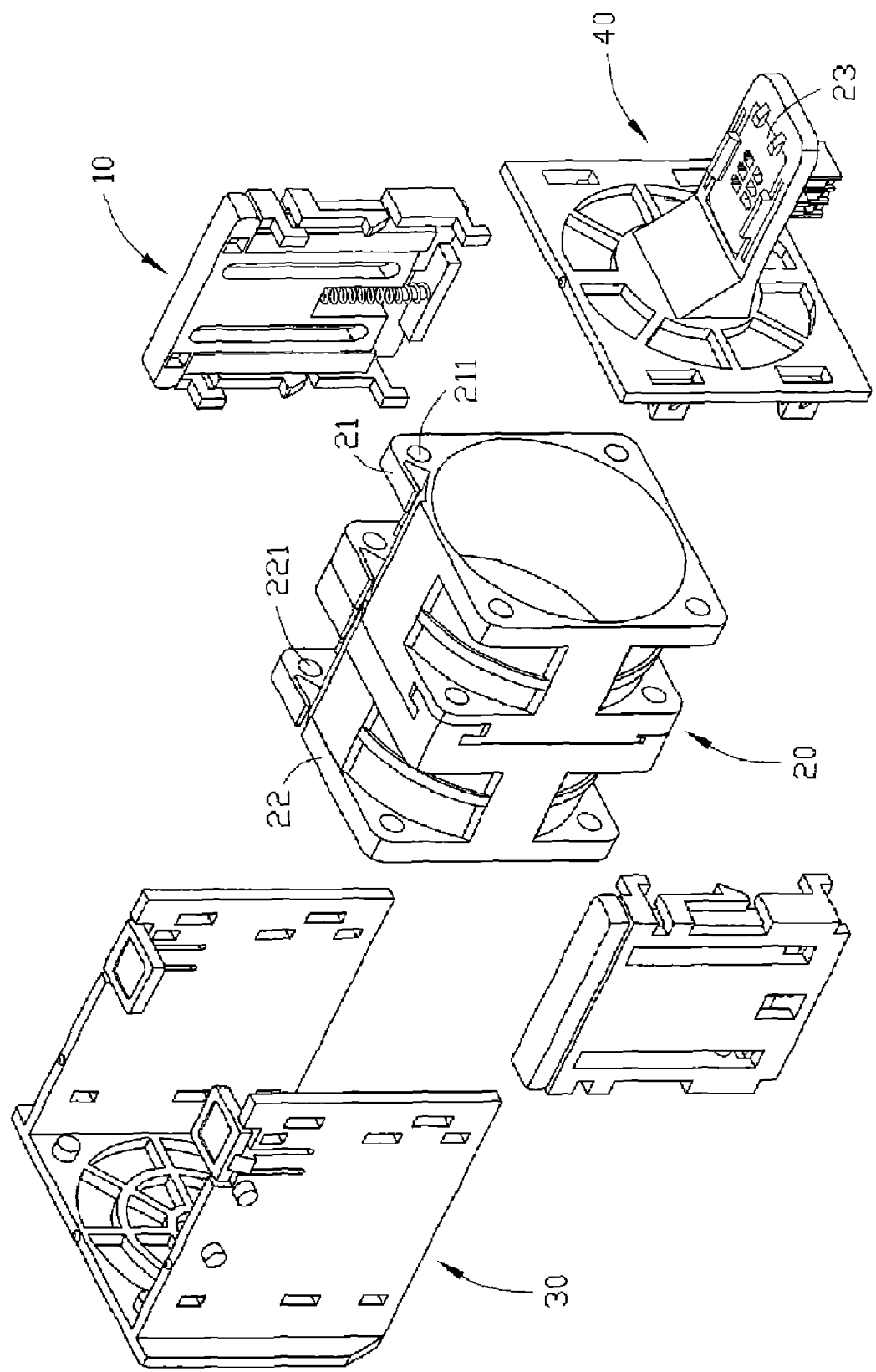
FIG. 2 is an exploded, isometric view of the bracket subassembly of FIG. 1, but viewed from another aspect, the bracket subassembly including a bracket, a pair of lift-out apparatuses attached to the bracket, and a positioning member fixed to the bracket.

Referring to FIG. 2, the bracket subassembly 1 includes a pair of lift-out apparatuses 10, a fan 20, a bracket 30, and a positioning member 40. The fan 20 has a front panel 21 and a rear panel 22 thereon. The front and rear panels 21, 22 define a mounting hole 211, 221 at each corner thereof. A second connector 23, electrically coupled to the fan 20, is mounted on the positioning member 40.

Figure 3:
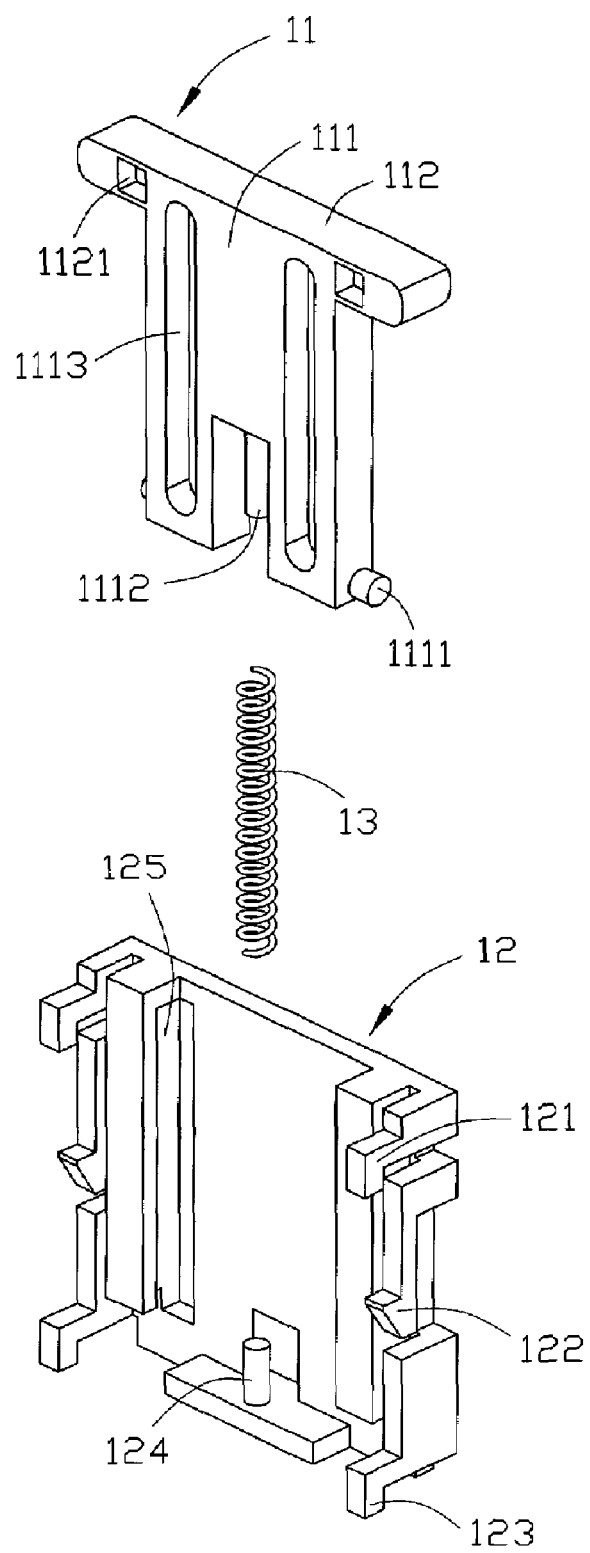
FIG. 3 is an exploded, isometric view of the lift-out apparatus of FIG. 2.

Referring to FIG. 3, each lift-out apparatus 10 includes a sliding member 11, a clasping member 12, and an elastic member 13. The elastic member 13 may be a coil spring or the like. The sliding member 11 includes a body 111, and a handle 112 formed on a top end of the body 111. A sliding post 1111 extends out from each side of the body 111 of the sliding member 11. A pair of elongated sliding slots 1113 is defined in the body 111. A positioning post 1112 is formed on a bottom end of the body 111 between the two sliding slots 1113 for positioning one end of the elastic member 13. Two ends of the handle 112 each define a locking hole 1121 therein, respectively. Each side of the clasping member 12 is formed to have a plurality of catches 121, 122, 123 arranged in a line. A positioning post 124 extends up from a bottom end of the clasping member 12 for positioning the other end of the elastic member 13. A pair of guiding slots 125, adjacent to the catches 121, 122, 123, is defined in the clasping member 12 for the corresponding sliding posts 1111 to slide therein.

Figure 4:
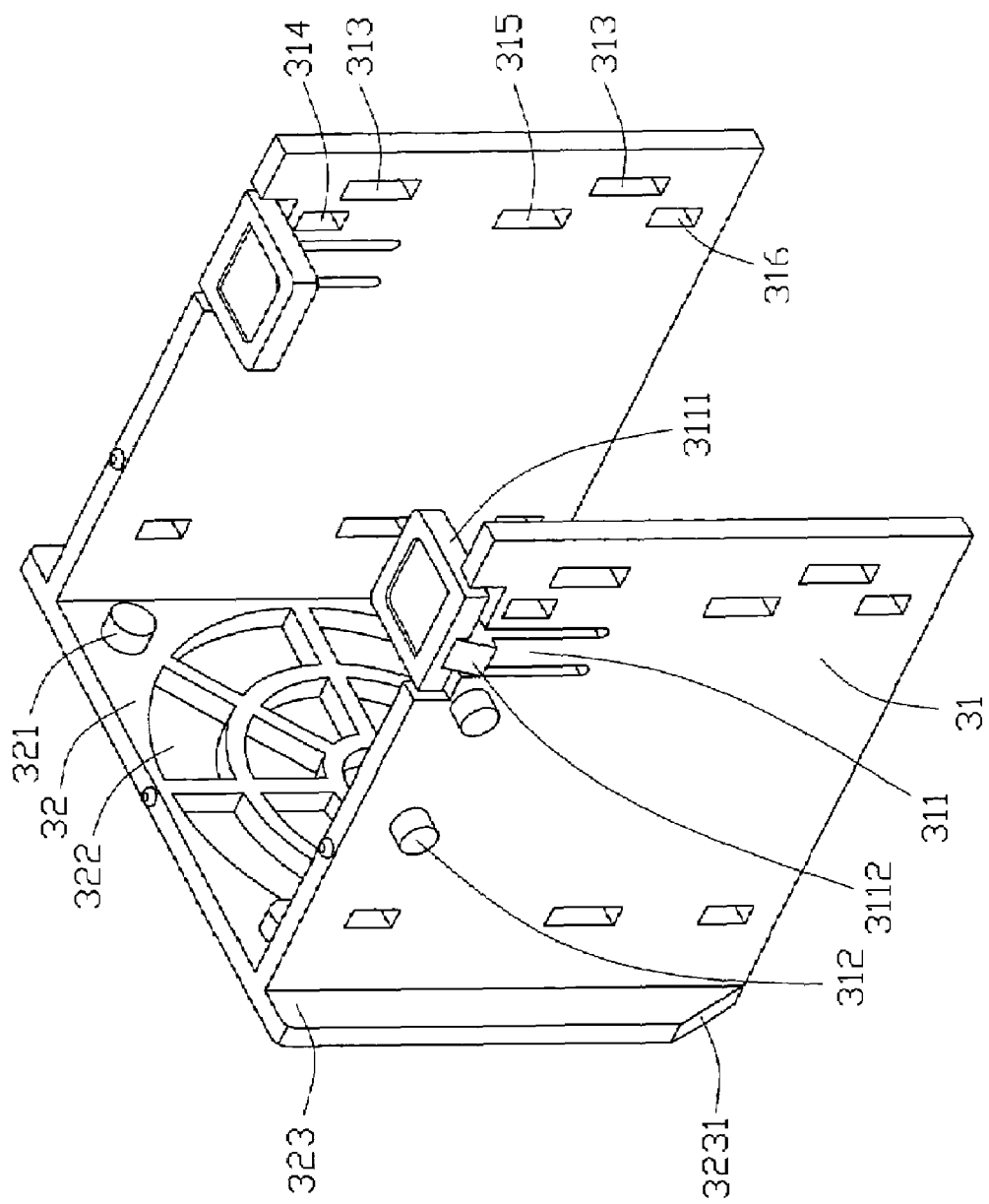
FIG. 4 is an enlarged, isometric view of the bracket of FIG. 2.

Referring to FIG. 4, the bracket 30 includes a rear wall 32 and two opposite sidewalls 31 extending from the rear wall 32. An upper portion of each sidewall 31 is formed to have an arm 311 with a free end thereon. A horizontal pressing portion 3111 is formed on each free end of the arms 311, and a locking block 3112 extends out from each free end of the arms 311. The locking blocks 3112 of the bracket 30 cooperate with the corresponding locking holes 1121 of the sliding members 11 to form locking structures. A pair of sliding posts 312, are formed adjacent each arm 311, and extend horizontally from the upper portion of the sidewalls 31. A plurality of rectangular through holes 314, 315, 316, arranged in a row, is defined in an edge of each side of the sidewalls 31, corresponding to the catches 121, 122, 123. A pair of locking holes 313 is defined in a front end of each sidewall 31. Four mounting posts 321 extend inward from the rear wall 32 and are symmetrically arranged on each corner thereof, corresponding to the mounting holes 221 of the fan 20. A plurality of vents 322 is defined in the rear wall 32 between the mounting posts 321 for flow of air therethrough. Two ends of the rear wall 32 are respectively formed to have a mounting tab 323 with a slant surface 3231, for sliding into the receiving tabs 61 of the securing plate 60.

Figure 5:
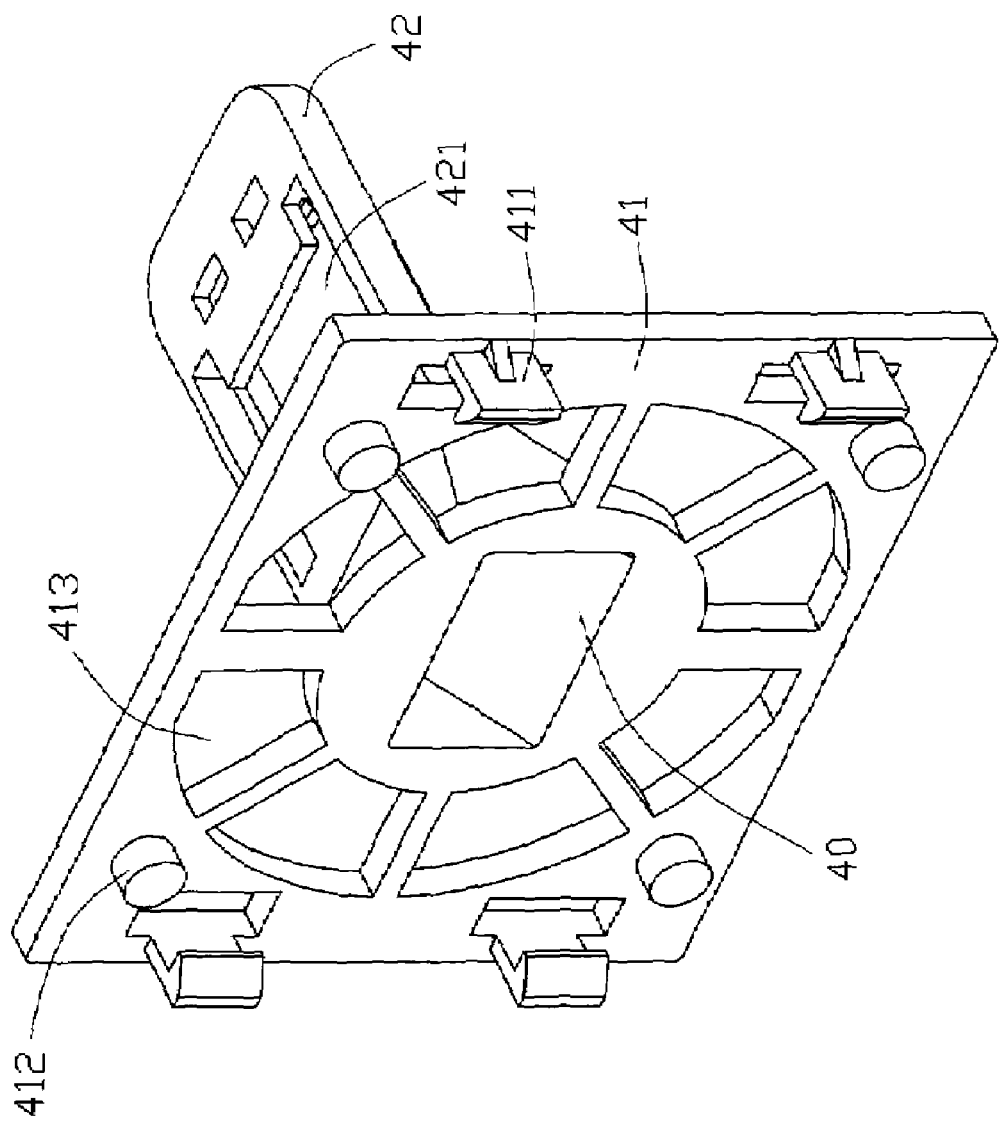
FIG. 5 is an enlarged, isometric view of the positioning member of FIG. 2, but viewed from another aspect.

Referring to FIG. 5, the positioning member 40 includes a base portion 41 and an extension portion 42 extending horizontally from the base portion 41. The base portion 41 is formed to have a locking block 411 at each corner thereof for engaging in the corresponding locking holes 313 of the bracket 30. The extension portion 42 defines an opening 421 therein for receiving the second connector 23.

Figure 6:
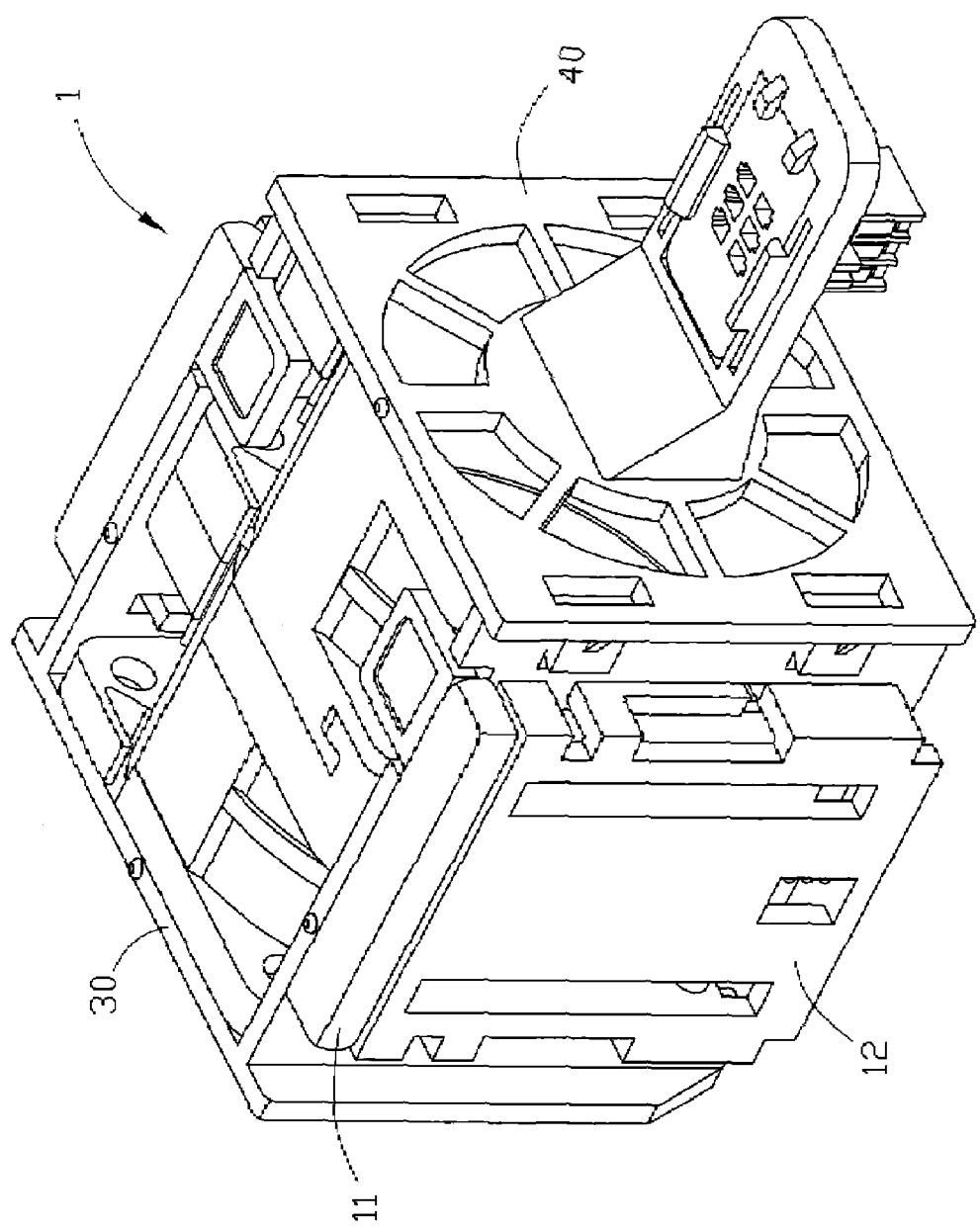
FIG. 6 is an assembled view of FIG. 2.

Referring also to FIG. 6, in assembly of the bracket subassembly 1, ends of the elastic member 13 are first disposed around the positioning posts 1112, 124 of the sliding member 11 and the clasping member 12 respectively. Then, the sliding member 11 is slanted to urge one of the sliding posts 1111 to insert in one of the guiding slots 125 of the clasping member 12. Subsequently, the other sliding post 1111 of the sliding member 11 inserts in the other guiding slot 125 of the clasping member 12, and the elastic member 13 is compressed. Thus, the sliding member 11 is slidably mounted to the clasping member 12. The sliding member 11, the clasping member 12, and the elastic member 13 cooperatively constitute the lift-out apparatus 10. When the catches 121, 122, 123 of the clasping member 12 engage in the corresponding through slots 314, 315, 316 of the bracket 30, the pair of lift-out apparatuses 10 is securely mounted on the sidewalls 31 of the bracket 30, respectively. The sliding members 11 are pressed down to urge the locking holes 1121 of the sliding members 11 to engage with the locking blocks 3112 of the bracket 30. Subsequently, the mounting posts 321 of the bracket 30 are aligned with and inserted through the mounting holes 221 of the fan 20. The mounting posts 412 of the positioning member 40 are aligned with and inserted through the mounting holes 211 of the fan 20. When the locking blocks 411 of the positioning member 40 respectively engage in the corresponding locking holes 313 of the sidewall 31 of the bracket 30, the fan 20 is securely sandwiched between the bracket 30 and the positioning member 40.

Figure 9:
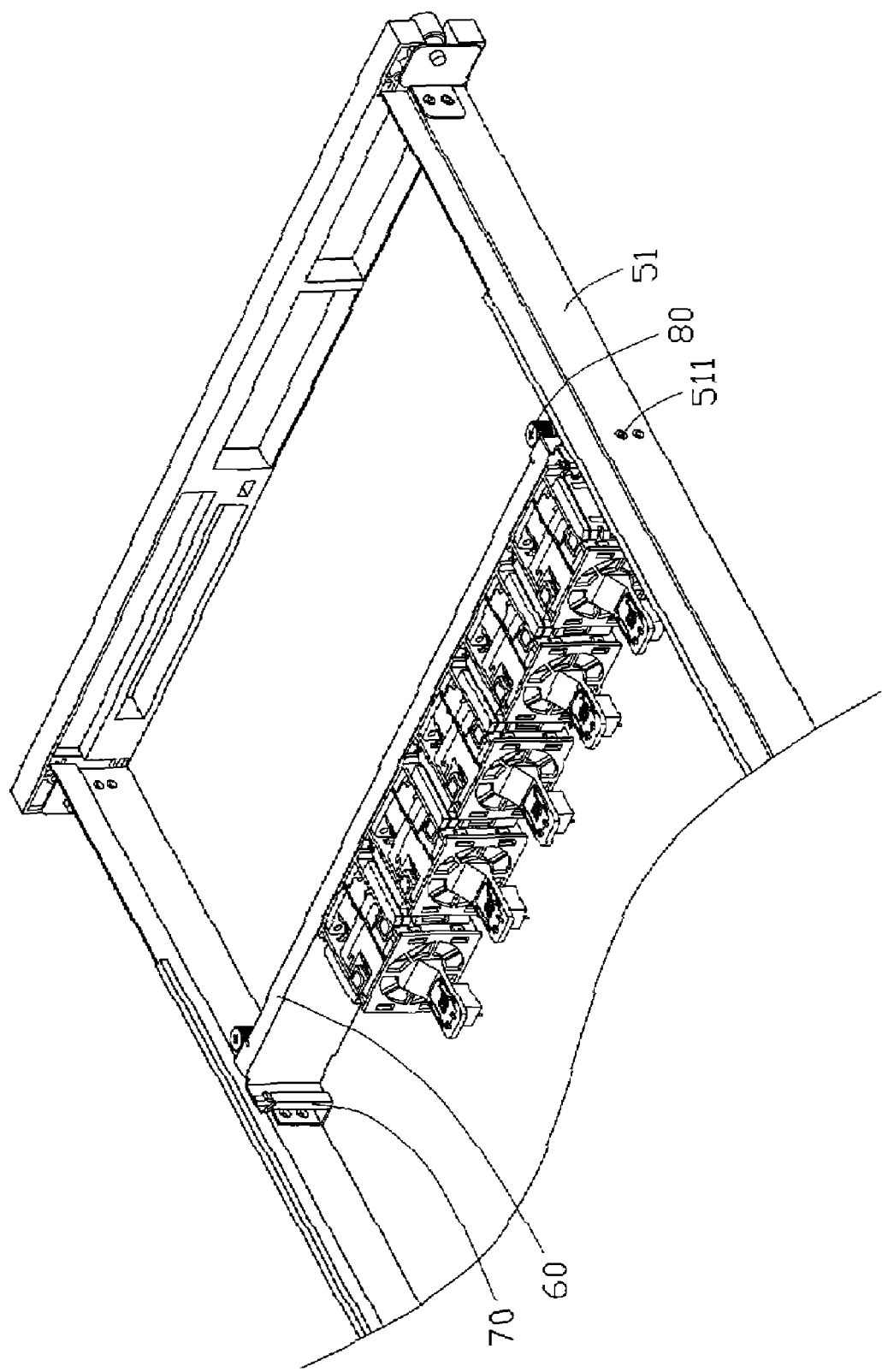
FIG. 9 is another assembled view of FIG. 1, but viewed from another aspect.

Referring to FIGS. 8 and 9, in assembly, the mounting tabs 323 of the bracket 30 are first aligned with the corresponding receiving tabs 61 of the securing plate 60. The bracket subassembly 1 is then pressed until the mounting tabs 323 are completely received in the receiving tabs 61 of the securing plate 60, and the second connector 23 is coupled to the first connector 521 of the chassis 50. Thus, if the sever is powered up at this time, the fan 20 starts to operate to dissipate the heat in the chassis 50 without shutting down or re-starting servers.

Figure 10:
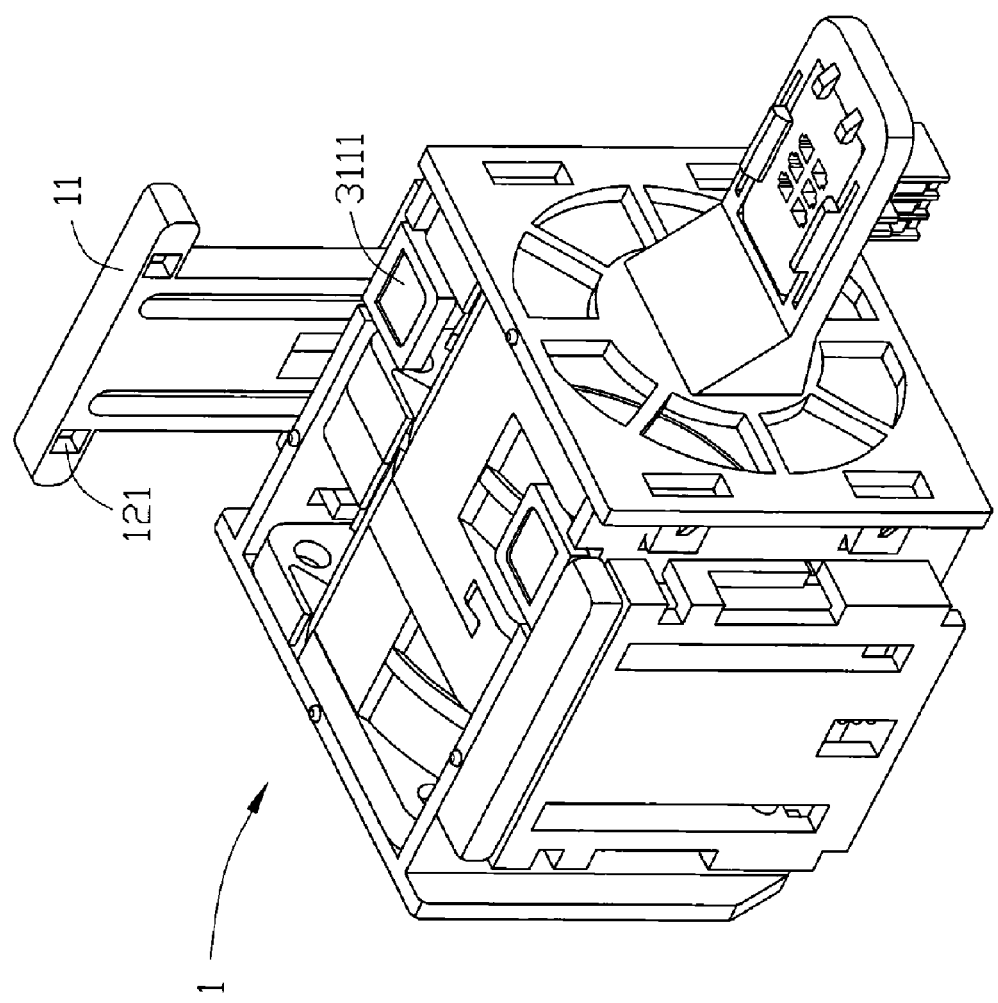
FIG. 10 is a disassembled view of FIG. 6.

Referring to FIG. 10, in removal of the bracket subassembly 1 from the chassis 50, the pressing portion 3111 of the arm 311 of the bracket 30 is first pressed down. Then the locking block 3112 of the arm 311 of the bracket 30 disengages from the locking hole 1121 of the sliding member 11. Accordingly, the sliding member 11 is lifted up due to rebounding of the elastic member 13. The handle 112 of the sliding member 11 is held and then lifted up to urge the bracket subassembly 1 to disengage from the securing plate 60. Thus, the bracket subassembly 1 can be drawn out of the chassis 50 in order to perform maintenance on the fan 20 or replace it.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A mounting assembly comprising:
    chassis comprising a securing plate, two opposite receiving tabs formed on the securing plate; and
    a bracket subassembly configured for accommodating a fan therein and slidably mounted to the chassis between the receiving tabs of the chassis in a first direction, the bracket subassembly comprising:
    a bracket comprising a rear wall and two opposite sidewalls extending from the rear wall, a locking block formed on each sidewall of the bracket;
    a pair of clasping members mounted to the corresponding sidewalls of the bracket respectively;
    a pair of sliding members slidably sandwiched between the corresponding sidewalls of the bracket end the corresponding clasping members, each sliding member defining a locking hole therein for engaging with the corresponding locking block of the bracket; and
    a positioning member transversely mounted on the opposite sidewalls of the bracket, wherein the positioning member and the bracket are configured for cooperatively fixing the fan in the bracket;
    wherein when the locking blocks of the bracket disengage from the corresponding locking holes of the sliding members, the sliding members are capable of being drawn in a second direction opposite to the first direction to thereby urge the bracket subassembly to disengage from the chassis.

2. The mounting assembly as described in claim 1, wherein the bracket subassembly further comprises a pair of elastic members compressedly attached to the corresponding sliding members and the corresponding clasping members for lifting up the corresponding sliding members relative to the clasping members.

3. The mounting assembly as described in claim 2, wherein each clasping member and each sliding member are respectively formed to have a positioning post, two opposite ends of the elastic member are placed around the two positioning posts respectively.

4. The mounting assembly as described in claim 1, wherein each sliding member defines a pair of sliding slots therein, and a pair of sliding posts extends from each sidewall of the bracket for sliding in the corresponding sliding slots.

5. The mounting assembly as described in claim 4, wherein each clasping member defines a pair of guiding slots therein, and a pair of sliding posts extends from each sliding member for sliding in the corresponding guiding slots.

6. The mounting assembly as described in claim 1, wherein a handle is formed on a top end of each sliding member for conveniently handling the bracket subassembly, and the locking hole is defined in the handle.

7. The mounting assembly as described in claim 1, wherein the positioning member forms a plurality of locking blocks and each clasping member forms a plurality of catches thereon, and the sidewall of the bracket defines a plurality of through slots therein for engaging with the corresponding catches of the clasping member and the corresponding locking blocks of the positioning member.

8. The mounting assembly as described in claim 1, wherein each sidewall of the bracket is formed to have an arm, the locking block is formed on the arm, and a pressing portion extends horizontally from a distal end of the arm.

9. The computer enclosure as described in claim 1, wherein a first connector is mounted to the chassis, and a second connector is mounted to the bracket subassembly configured for coupling to the first connector.

10. A mounting assembly comprising:
a chassis comprising a securing plate, a plurality of opposite receiving tabs formed on the securing plate; and
a plurality of bracket subassemblies slidably mounted to the chassis along the receiving tabs of the securing plate, each bracket subassembly receiving a fan, comprising:
a bracket comprising a rear wall and two opposite sidewalls extending from the rear wall;
a positioning member transversely mourned on the opposite sidewalls of the bracket, wherein the positioning member and the bracket cooperatively fix the fbn in the bracket; and
a lift-out apparatus attached to one of the sidewalls of the bracket, the lift-out apparatus comprising:
a clasping member fixed to the sidewall of the bracket;
a sliding member slidably being attached with respective to the clasping member; and
an elastic member compressedly attached to the sliding member and clasping member;
wherein a locking structure is formed on the sliding member and the sidewall of the bracket for detachably engaging the sliding member with the bracket;
wherein when the locking structure is unlocked, the sliding member is capable of being lifted out due to rebounding of the elastic member, and then the sliding member is capable of being pulled to urge the bracket subassembly to disengage from the chassis.

11. The mounting assembly as described in claim 10, wherein the locking structure comprises a locking hole defined in one of the sliding member and the sidewall of the bracket and a locking block formed on the other one of the sliding member and the sidewall of the bracket, and the locking block engaging in the locking hole.

12. The mounting assembly as described in claim 11, wherein the sidewall of the bracket is formed to have an elastic arm, the locking block is formed on the arm, and a pressing portion is formed on the arm for urging the locking block to disengage from the locking hole of the sliding member.

13. The mounting assembly as described in claim 12, wherein a handle is formed on the sliding member for handling the bracket subassembly, and the locking hole is defined in the handle.

14. The mounting assembly as described in claim 10, wherein the clasping member and the sliding member are respectively formed to have a positioning post, two opposite ends of the elastic member are placed around the two positioning posts respectively.

15. The mounting assembly as described in claim 10, wherein the sliding member defines a pair of sliding slots therein, and a pair of sliding posts extends from the sidewall of the bracket for sliding in the corresponding sliding slots.

16. The mounting assembly as described in claim 10, wherein the clasping member defines a pair of guiding slots therein, and a pair of sliding posts extends from the sliding member for sliding in the corresponding guiding slots.

17. The mounting assembly as described in claim 10, wherein a plurality of mounting posts extends in from the positioning member and the rear wall of the bracket, and a front panel and a rear panel of the fan defines a plurality of mounting holes for extension of the corresponding mounting posts therethrough.

18. A mounting assembly comprising:
a chassis comprising a securing plate and a first connector,
a plurality of pairs of opposing receiving tabs formed on the securing plate; vents being defined at the securing plate between each pair of opposing receiving tabs, and
a plurality of bracket subassemblies mounted within the chassis, each bracket subassembly being slidably secured between one pair of the receiving tabs of the securing plate, each bracket subassembly comprising:
a bracket slidably attached between the pair of the receiving tabs;
a lift-out apparatus attached to the bracket and comprising a sliding member being capable of sliding relative to the bracket;
a second connector configured for connecting with the first connector; and
vents communicating with vents of the securing plate,
a plurality of fans each locked in a corresponding one of the bracket suhassemblies, each fan being electrically connected with the second connector of said corresponding one of the bracket subassemblies and communicating with inside of the chassis via the vents of said corresponding one of the bracket subassemblies and the vents of the securing plate;
wherein the sliding member is locked with respective to the bracket via a locking structure, and when the sliding member is released from the locking structure, the sliding member is lifted with respective to the bracket by an elastic force.

19. The mounting assembly as described in claim 18, wherein the lift-out apparatus further comprises a clasping member securely attached to the bracket, and an elastic member is compressed between the sliding member and the clasping member for providing the elastic force.

* * * * *